United States Patent [19]

Tobita

[11] Patent Number: 4,951,256
[45] Date of Patent: Aug. 21, 1990

[54] APPARATUS AND METHOD FOR DRIVING SENSE AMPLIFIER IN DYNAMIC RANDOM ACCESS MEMORY

[75] Inventor: Youichi Tobita, Hyogo, Japan

[73] Assignee: Mitsubishi Denki Kabushiki Kaisha, Tokyo, Japan

[21] Appl. No.: 262,301

[22] Filed: Oct. 25, 1988

[30] Foreign Application Priority Data

Nov. 18, 1987 [JP] Japan .................... 62-292721

[51] Int. Cl.$^5$ .................................................. G11C 7/00
[52] U.S. Cl. ...................................... 365/208; 365/210; 365/189.11
[58] Field of Search .................. 365/189.11, 205, 207, 365/208, 210; 307/530

[56] References Cited

U.S. PATENT DOCUMENTS

4,792,928  12/1988  Tobita .................... 365/207

Primary Examiner—Joseph A. Popek
Attorney, Agent, or Firm—Lowe, Price, Leblanc, Becker & Shur

[57] ABSTRACT

In a dynamic random access memory having first and second sense amplifier driving signal lines, there are provided a coupling capacitance (41) between the first and second sense amplifier driving signal lines (14, 17) in order to transmit the shift in potential which appears on one of the sense amplifier driving signal lines to the other sense amplifier driving signal line.

11 Claims, 11 Drawing Sheets

FIG. 6(b) BIT LINE 2

FIG. 6(c) BIT LINE 7

FIG. 6(d) $\phi_A$

FIG. 6(e) $\phi_B$

FIG. 8(b) BIT LINE 2

FIG. 8(c) BIT LINE 7

$\phi_B$
FIG. 8(d)

$\phi_A$
FIG. 8(e)

FIG. 8(f) $\phi_T$ $\overline{\phi}_T$
FIG. 8(g)

$\phi_S$
FIG. 8(h)

APPARATUS AND METHOD FOR DRIVING SENSE AMPLIFIER IN DYNAMIC RANDOM ACCESS MEMORY

BACKGROUND OF THE INVENTION

1. Field of the Invention

The present invention relates generally to an apparatus and a method for driving a sense amplifier circuit employed in a dynamic random access memory or the like, and more particularly, to an improvement of the amplification factor of the sense amplifier circuit.

2. Description of the Prior Art

Figure 1:
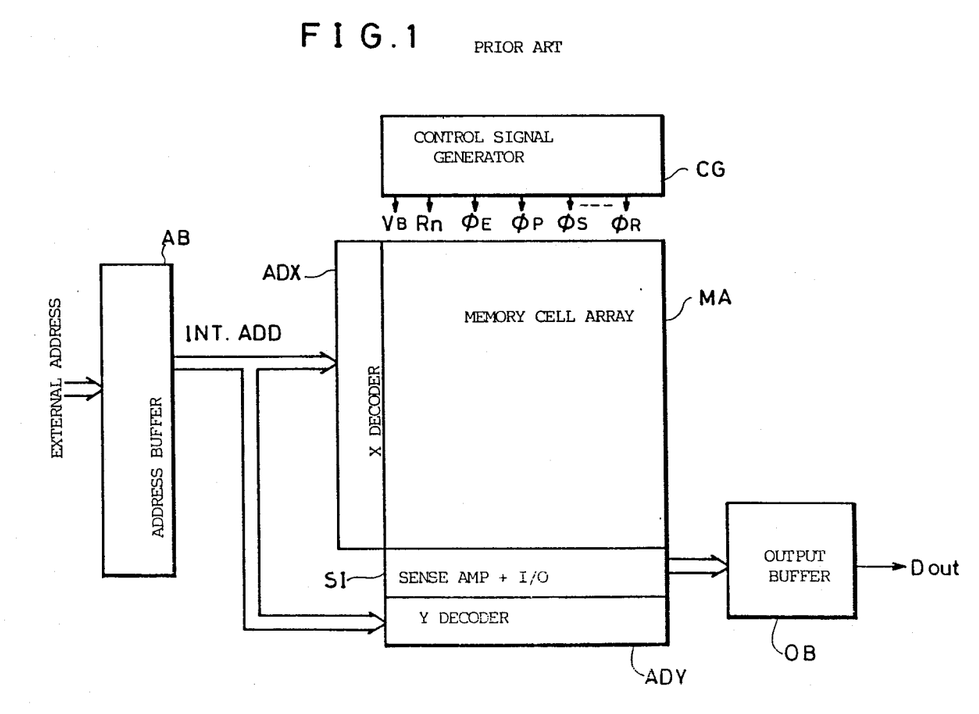
FIG. 1 is a diagram showing a schematic structure of a data read-out portion in a conventional dynamic random access memory to which the present invention is applied.

FIG. 1 is a diagram showing a schematic structure of the whole of a data-reading portion of a dynamic random access memory to which the present invention will be applied. In FIG. 1, the dynamic random access memory comprises a memory cell array MA having memory cells for storing information arranged in a plurality of rows and columns, an address buffer AB receiving an external address externally applied for generating an internal address, an X decoder ADX for decoding the internal address from the address buffer AB to select a corresponding row in the memory cell array, a Y decoder ADY for decoding the internal column address from the address buffer AB to select a corresponding column or columns in the memory cell array, a (sense amplifier and I/O) block SI for detecting and amplifying information stored in the selected memory cell in the memory cell array MA and transmitting the same to an output buffer OB in response to a signal from the Y decoder ADY, and the output buffer OB receiving read-out data from the (sense amplifier and I/O) block SI for transmitting output data Dout to an exterior. In addition, there is provided as a peripheral circuit a control signal generating system CG for generating control signals for controlling timing of various operations of the dynamic random access memory. The details of each of the control signals generated by the control signal generating system CG will be described below.

Figure 2:
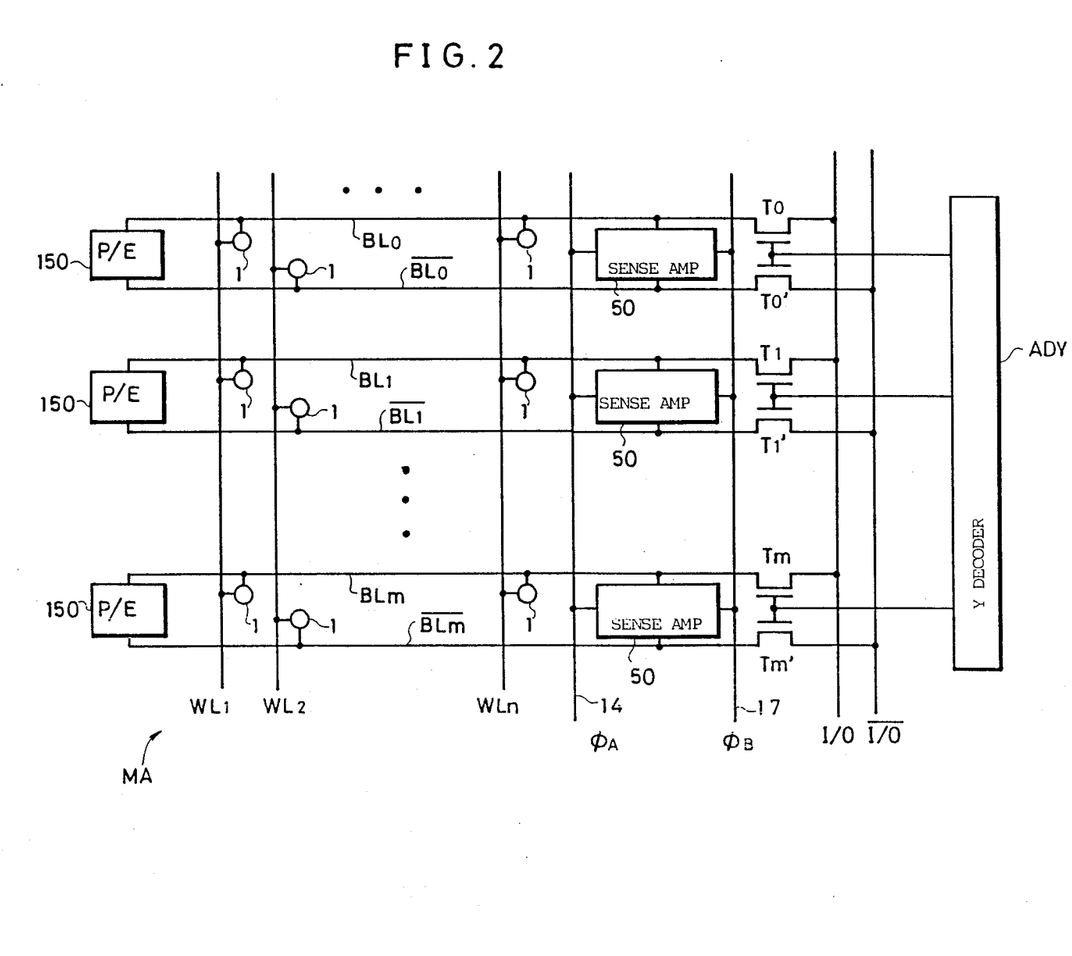
FIG. 2 is a block diagram showing a detailed structure of a memory cell array portion shown in FIG. 1.

FIG. 2 is a diagram showing a schematic structure of the memory cell array portion shown in FIG. 1. In FIG. 2, a memory cell array MA comprises a plurality of word lines WL1, WL2, ..., WLn and a plurality of bit lines BL0, $\overline{BL0}$, BL1, $\overline{BL1}$, ..., BLm, $\overline{BLm}$. One row of memory cells is connected to one of the word lines WL1, ..., WLn. The bit lines constitute folded bit lines, so that two bit lines constitute one bit line pair. More specifically, the bit lines BL0 and $\overline{BL0}$ constitute one bit line pair, and the bit lines BL1 and $\overline{BL1}$ constitute bit line pair. In the same manner, the bit lines BLn and $\overline{BLn}$ constitute one bit line pair. A memory cell 1 is disposed at an intersection of each of the bit lines BL0, $\overline{BL0}$, ..., BLm, $\overline{BLm}$ and every other word line. More specifically, in each of the bit line pairs, a memory cell is located at an intersection of one word line and either one bit line of the bit line pair. There is provided for each of one bit line pairs a precharging/equalizing circuit 150 for equalizing potentials on each of the bit line pairs and precharging the bit line pair to a predetermined potential $V_B$. In addition, there is provided for each of the bit line pairs a sense amplifier 50 responsive to signals $\phi A$ and $\phi B$ transmitted onto signal lines 14 and 17 to be activated for detecting the potential difference between the bit line pair and differentially amplifying the same. Each of the bit lines is selectively connected to data input/output buses I/O and $\overline{I/O}$ in response to an address decoded signal from a Y decoder ADY. More specifically, the bit lines BL0 and $\overline{BL0}$ are connected to the data input/output lines I/O and $\overline{I/O}$ through transfer gates T0 and T0', respectively. In the same manner, the bit lines BL1 and $\overline{BL1}$ are connected to the data input/output lines I/O and $\overline{I/O}$ through transfer gates T1 and T1l', respectively, and the bit lines BLm and $\overline{BLm}$ are connected to the data input/output lines I/O and $\overline{I/O}$ through the transfer gates Tm and Tm', respectively. The address decoded signal from the Y decoder ADY is transmitted to a gate of each of the transfer gates T0, T0', ..., Tm, Tm'. Consequently, one bit line pair is connected to the data input/output lines I/O and $\overline{I/O}$.

Figure 3:
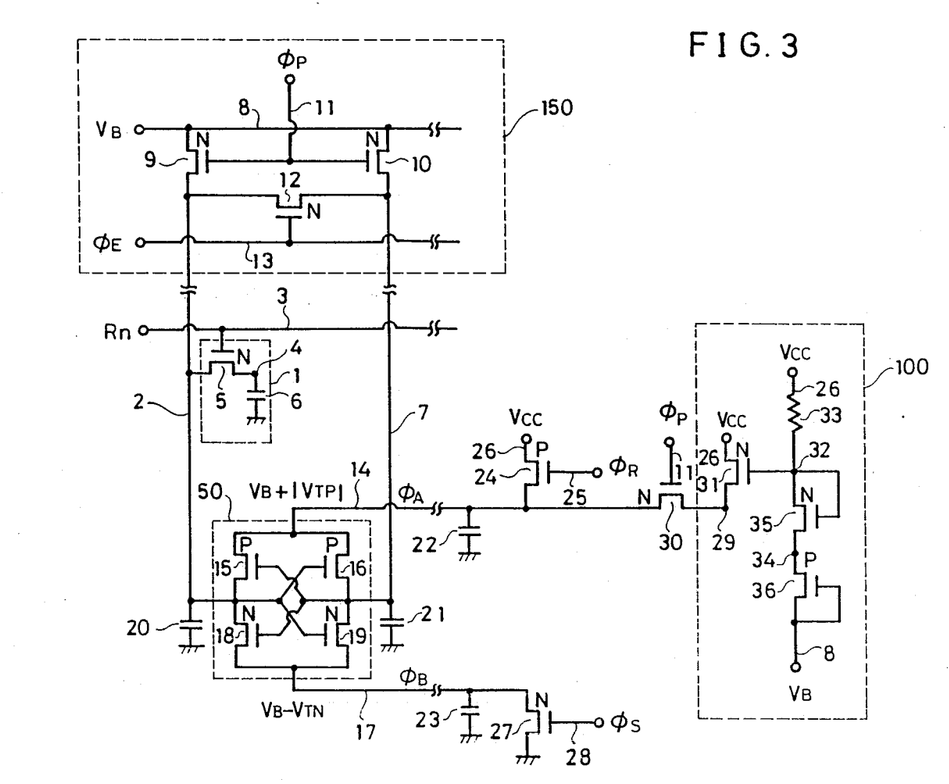
FIG. 3 is a diagram showing conventional structures of pair of bit lines and a sense amplifier and a sense amplifier driving system.

FIG. 3 is a diagram showing a detailed structure of one bit line pair out of the bit line pairs shown in FIG. 2 and a sense amplifier control circuit associated therewith. In FIG. 3, only one word line is shown to avoid the complexity of the drawing.

A precharging/equalizing circuit 150 for precharging one bit line pair 2 and 7 to a predetermined potential $V_B$ at a standby time as well as equalizing potentials on the bit lines 2 and 7 to the predetermined potential comprises an n channel insulated gate field effect transistor (referred to as MIS transistor hereinafter) responsive to a precharging signal $\phi P$ for transmitting the predetermined precharge potential $V_B$ to both the bit lines 2 and 7, and an n channel MIS transistor 12 responsive to an equalizing signal $\phi E$ applied through a signal line 13 for electrically connecting the bit lines 2 and 7 thereby to equalize the potentials on the bit lines 2 and 7. n channel MIS transistors 9 and 10 for precharging are rendered conductive in response to the precharging signal $\phi P$ applied through a signal line 11, to transmit the precharge potential $V_B$ transmitted onto a signal line 8 to the bit lines 2 and 7, respectively.

A sense amplifier 50 for differentially amplifying signals on the bit lines 2 and 7 comprises a pair of cross-coupled p channel MIS transistors 15 and 16 connected to the bit lines 2 and 7, respectively, and a pair of cross-coupled n channel MOS transistors 18 and 19 connected to the bit lines 2 and 7, respectively. The p channel MIS transistors 15 and 16 have their respective remaining electrodes connected together to a signal line 14, to receive a signal $\phi A$. The n channel MOS transistors 18 and 19 have their respective remaining electrodes connected to a signal line 17 to receive a signal $\phi B$ on the signal line 17.

There is provided for the first sense amplifier driving signal line 14 a p channel MIS transistor 24 responsive to a control signal $\phi R$ for providing timing for activating a sense amplifier, to be rendered conductive for transmitting a power-supply potential Vcc onto the first sense amplifier driving signal line 14, an n channel MIS transistor 30 for keeping the first sense amplifier driving signal line 14 at a predetermined potential during a bit line precharging time period, and a constant voltage generating circuit 100.

There is provided for the second sense amplifier driving signal line 17 an n channel MIS transistor 27 responsive to a second control signal $\phi S$ for providing timing for activating a sense amplifier for connecting the second sense amplifier driving signal line 17 to a ground potential.

The p channel MIS transistor 24 for charging the first sense amplifier driving signal line 14 to the power-supply potential Vcc receives the sense amplifier activating signal $\phi R$ at its gate through a signal line 25 and the power-supply potential Vcc through a signal line 26 at one conduction terminal. The n channel MIS transistor 27 for discharging the second sense amplifier driving signal line 17 to the ground potential receives the second sense amplifier activating signal φS through a signal line 28.

The constant voltage generating circuit 100 comprises a resistance 33 having its one terminal connected to the power-supply potential Vcc through the signal line 26, an n channel MIS transistor 35 of diode connection connected to the resistance 33 through a node 32, a p channel MIS transistor 36 of diode connection connected in series to the n channel MIS transistor 35 through a node 34, and an n channel MIS transistor 31 receiving a potential on the node 32 at its gate and at its one conduction terminal the power-supply potential Vcc through the signal line 26 for transmitting a predetermined potential to a node 29. The n channel MIS transistor 30 is responsive to a precharging signal φP to be rendered conductive for transmitting a potential on the node 29 onto the first sense amplifier driving signal line 14.

The n channel MIS transistor 35 has its gate and drain connected to the node 32, and makes the potential on the node 32 higher, by a threshold voltage $V_{TN}$ of the transistor 35, than a potential on the node 34. The p channel MIS transistor 36 has both its gate and drain connected to a precharge potential $V_B$ through a signal line 8. Thus, a voltage higher, by the absolute value of a threshold voltage $V_{TP}$ of the transistor 36, than the precharge potential $V_B$ is applied to the node 34. The resistance 33 is provided for only supplying a voltage to the node 32, and has a large resistance value of several MΩ to several tens MΩ. In this structure, the potential on the node 32 becomes $V_B+|V_{TP}|+V_{TN}$. The n channel MIS transistor 31 has a threshold voltage $V_{TN}$, thereby to transmit a potential of $V_B+|V_{TP}|$ to the node 29.

A memory cell 1 comprises a transfer gate 5 having its gate connected to a word line 3 and its source connected to the bit line 2, and a capacitance 6 connected to a drain of the transfer gate 5 through a node 4. Data in the memory cell 1 is stored in the node 4. That is, the node 4 is a so-called storage node.

At the time of selecting the word line 3, a word line driving signal Rn is transmitted on the selected word line, so that the transfer gate 5 formed of an n channel insulated gate field effect transistor is rendered conductive, whereby information stored in the memory cell 1 is transmitted onto the bit line 2. Although a memory cell connected to the bit line 7 is not shown, a memory cell is not provided at an intersection of the word line 3 and the bit line 7. Thus, in the structure shown in FIG. 3, when the memory cell 1 is selected, the bit line 7 provides a reference potential for the bit line 2.

The bit lines 2 and 7 have parasitic capacitances 20 and 21, respectively, and the first sense amplifier driving signal lines 14 and 17 have parasitic capacitances 22 and 23, respectively.

Figures 4A, 4I:
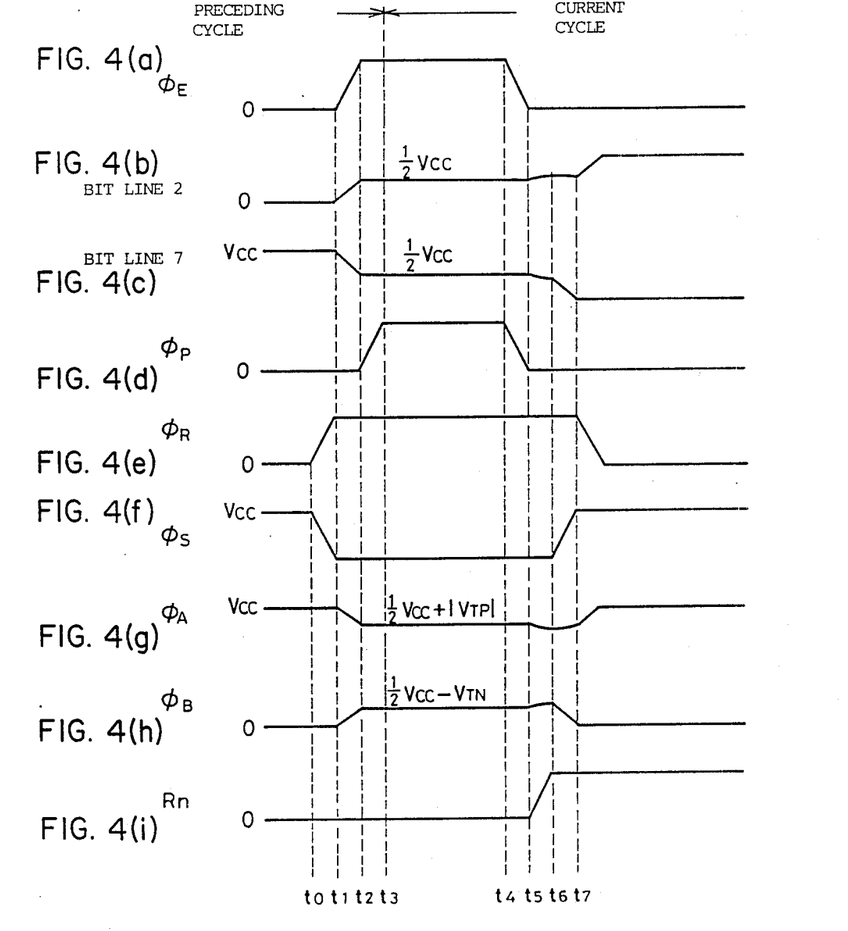

FIG. 4 is a waveform diagram for explaining an operation of the circuit structure shown in FIG. 3. FIG. 4 shows an operation to occur when data of logic "1" is stored in the memory cell 1 and information "1" stored in the memory cell 1 is read out. Since an operation continued from the preceding cycle must be explained in order to explain a data reading operation from the memory cell 1, FIG. 4 also shows a waveform diagram of the operation in the preceding cycle as well.

Referring now to FIGS. 3 and 4, description is made on an operation to occur when data of logic "1" stored in the memory cell 1 is read out.

It is assumed that in the preceding cycle, data is read out from a memory cell connected to the bit line 2 or 7, so that the potential on the bit line 2 is in a state of 0V and the potential on the bit line 7 is in a state of Vcc. This state is not exclusive. The reversed state is possible depending on data stored in the memory cell read out in the preceding cycle. After a level of a word line (not shown) which selected the memory cell in the preceding cycle becomes 0V, the sense amplifier driving signals φS and φR start to fall and rise at a time t0, respectively, so that the MIS transistors 27 and 24 are both rendered non-conductive, whereby the sense amplifier 50 is inactivated.

At a time t1, an equalizing signal φE starts to rise, the equalizing MIS transistor 12 is rendered conductive. As a result, charges are moved from a bit line 7 at a high potential toward the bit line 2 at a low potential, so that the potentials on the bit lines 2 and 7 are both equalized to Vcc/2. Before the potential on each of the bit lines 2 and 7 becomes Vcc/2, conduction between the sense amplifier driving signal lines 14 and 17 is effected by the MIS transistors included in the sense amplifier 50, so that charges are moved from the sense amplifier driving signal line 14 at a high potential to the sense amplifier driving signal line 17 at a low potential. More specifically, a potential on the sense amplifier driving signal line 14 becomes in the potential $Vcc/2+|V_{TP}|$ which is higher, by the absolute value of the threshold voltage $V_{TP}$ of the MIS transistors 15 and 16, than the equalized potential Vcc/2 on the bit lines. On the other hand, a potential on the sense amplifier driving signal line 17 becomes $Vcc/2-V_{TN}$ which is lower, by the threshold voltage $V_{TN}$ of the MIS transistors 18 and 19, than the equalize potential Vcc/2 on the bit lines.

At a time t2, the precharging clock signal φP rises from 0V in order to stabilize the potentials on the bit lines 2 and 7 at a Vcc/2 level, so that the precharging MIS transistors 9 and 10 are rendered conductive, whereby a power supply line 8 having a potential of Vcc/2 is connected to the bit lines 2 and 7. The precharge potential $V_B$ is set to one-half of an operating power-supply potential Vcc, i.e., Vcc/2.

At a time t3, the rise of the precharging clock signal φP is terminated, so that the operation in the preceding cycle is terminated.

At a time t4, equalizing and charging of the bit lines 2 and 7 are terminated to complete the previous cycle, and then the current cycle is started. Consequently, both the bit line equalizing signal φE and the precharging clock signal φP start to fall, whereby the MIS transistors 9, 10 and 12 are rendered non-conductive.

At a time t5, the word line 3 is selected in response to the row address decoded signal from the X decoder. Consequently, the word line selecting signal Rn is transmitted onto the word line 3, whereby the potential on the word line 3 is raised. As a result, the MIS transistor 5 is rendered conductive so that charges stored in the capacitance 6 are moved toward the bit line 2, whereby the potential on the bit line 2 starts to be raised. The change in potential on the bit line 2 causes the MIS transistor 19 included in the sense amplifier 50 to be rendered conductive. As a result, the potentials on the bit line 7 and the sense amplifier driving signal lines 14 and 17 are changed, respectively. The details of the changes in potential on the bit line 7 and the sense amplifier driving signal lines 14 and 17 will be described below. The change in potential on the bit line 2 is very small (several 100s mV) and generally has a rising time constant of several 10ns.

At a time t6, the sense amplifier driving signal $\phi S$ rises, so that a very small difference in signal between the bit lines 2 and 7 is amplified by driving the sense amplifier 50. On this occasion, in order to stably operate the sense amplifier 50, it is desirable that an input signal thereof, i.e., the potential difference between the bit lines 2 and 7 is made as large as possible. In order to increase the potential difference between the bit lines 2 and 7, a time interval between the time t5 and the time t6 must be enlarged. However, in order to enhance the speed of reading out data stored in the memory cell, the time interval between the time t5 and the time t6 is generally set to a period between 15 and 25ns.

At a time t7, amplification of the potential difference in the signals by the sense amplifier 50 is terminated, so that the potential on the bit line 7 becomes a ground potential, whereby the potential difference is further increased.

Then, at the time t7, the bit line charging signal $\phi R$ also falls, so that the charging MIS transistor 24 is rendered conductive, whereby the potential on the sense amplifier driving signal line 14 is raised up to the power-supply potential Vcc. As a result, the bit line 2 is charged to the power-supply potential Vcc level through the MIS transistor 15 in the sense amplifier 50. Thus, a sensing operation performed by the sense amplifier 5 is completed. In this case, an operation triggered by the signal $\phi S$ and an operation triggered by the signal $\phi R$ may be distinguished from each other as a sensing operation and a restoring operation, respectively. However, in the following description, both operations are defined as a sensing operation.

After the potentials on the bit lines 2 and 7 are established to be the power-supply potential Vcc and the ground potential 0V, respectively, the bit lines 2 and 7 are connected to the data input/output lines I/O and $\overline{\text{I/O}}$ in response to an output of a Y decoder, respectively, so that data are read out.

Figure 5:
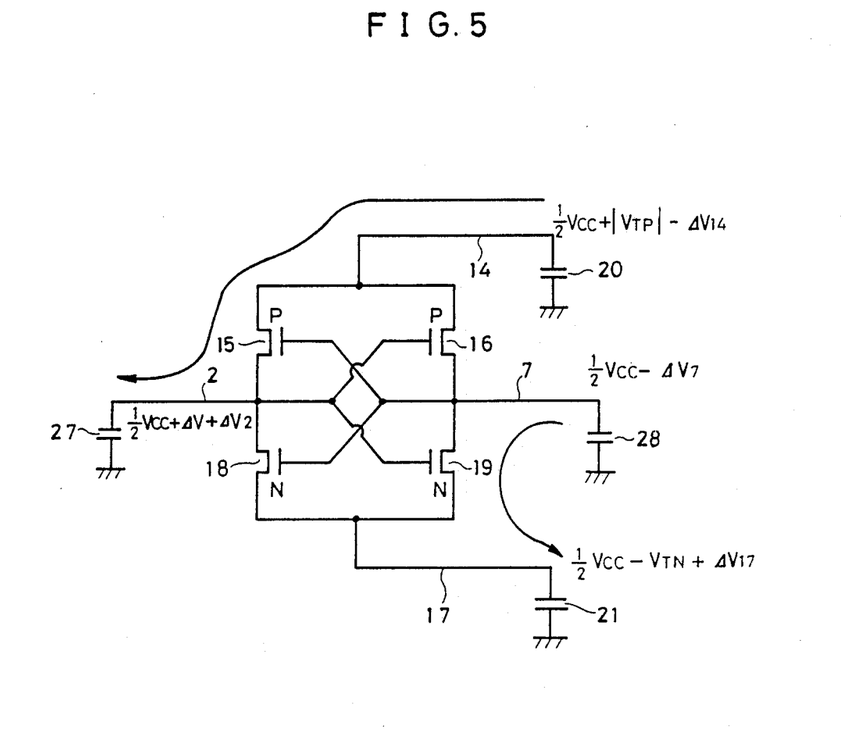
FIG. 5 is a diagram showing the flow of charges and the shift in potential on bit lines and a sense amplifier driving signal lines at the time of reading out data stored in a memory cell.
Figure 6A:
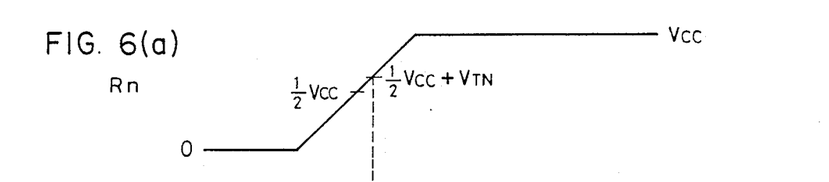
Figure 6B:
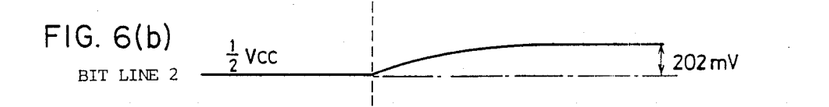
Figure 6C:
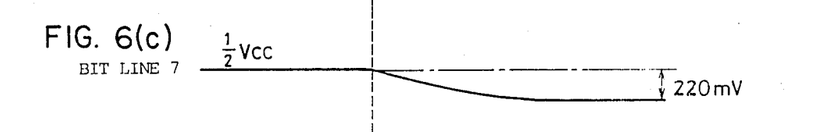
Figure 6D:
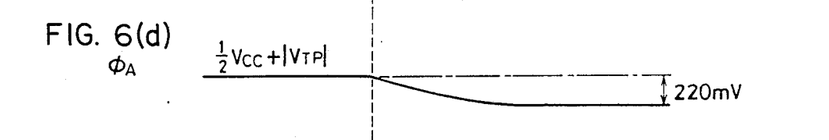
Figure 6E:
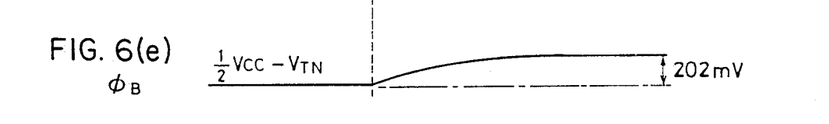

Referring now to FIGS. 5 and 6, a very small change in potential at the time of reading out data on the bit line will be described in detail.

FIG. 5 is a diagram showing a potential after the movement of charges between a sense amplifier driving signal line and a bit line through a sense amplifier and the change in potential on each signal line.

FIG. 6 is a diagram showing the change in potential on each signal line at the time of reading out data in a memory cell.

It is assumed that data of logic "1" is read out from the memory cell 1. In this case, when the word line driving signal Rn applied to the word line 3 rises so that the potential level thereof exceeds $Vcc/2 + V_{TN}$, the MIS transistor 5 in the memory cell 1 starts to be rendered conductive, whereby the bit line 2 and the node 4 are connected to each other. Consequently, charges are moved from the node 4 toward the bit line 2, so that the potential on the bit line 2 is raised. Due to the rise in potential on the bit line 2, the MIS transistor 19 starts to be conductive, so that charges move from the bit line 7 toward the sense amplifier driving signal line 17. Consequently, the potential on the sense amplifier driving signal line 17 is raised and the potential on the bit line 7 is lowered. Due to the fall of the potential on the bit line 7, the MIS transistor 15 is rendered conductive, so that charges move from the sense amplifier driving signal line 14 toward the bit line 2. Consequently, the potential on the bit line 2 is raised. When the above described phenomenon is repeated, it would be considered that the potential on the bit line 2 is gradually raised. In practice, since the capacitance value of the parasitic capacitance 21 of the sense amplifier driving signal line 17 is smaller than the capacitance value of the parasitic capacitance 28 of the bit line 7, the potential on the sense amplifier driving signal line 17 is raised faster than the fall rate of the potential on the bit line 7. Consequently, the MIS transistor 19 is not easily rendered conductive, so that the rise of potential on the bit line 2 completes out at a relatively small value. In order to further raise the potential on the bit line 2, one approach may be considered that a capacitance is added to the sense amplifier driving signal line 17. However, in this approach, the discharging time constant of a discharge path from the bit line 7 is increased, so that the potential on the bit line 7 may not so lowered.

The above described phenomenon of the change in potential on the bit lines 2 and 7 is a transient phenomenon. The details thereof require analysis through calculation. Referring now to FIG. 5, description is made on the final state in which the movement of charges is stopped for the purpose of rough comparison with the structure in the present invention as described below.

As shown in FIG. 5, it is assumed that the changes in potential on the bit lines 2 and 7 after the movement of charges and the sense amplifier driving signal lines 14 and 17 are $\Delta V + \Delta V2$, $\Delta V7$, $\Delta V14$ and $\Delta V17$, respectively, where $\Delta V$ denotes the amount of the shift in potential caused by reading out data of logic "1" from the memory cell 1. In addition, it is assumed that the capacitance values of the parasitic capacitances 20, 21, 27 and 28 are C20, C21, C27 and C28, respectively.

First, the case is considered where charges are moved between the bit line 2 and the sense amplifier driving signal line 14. In this case, from the conservation law of charges, the following equation is obtained:

$$(Vcc/2 + \Delta V) \cdot C27 + (Vcc/2 + |V_{TP}|) \cdot C20 =$$
$$(Vcc/2 + \Delta V + \Delta V2) \cdot C27 + (Vcc/2 + |V_{TP}| - \Delta V14) \cdot C20,$$

That is, $$C27 \cdot \Delta V2 = C20 \cdot \Delta V14 \tag{1}$$

Similarly, from the conservation law of charges between the bit line 7 and the sense amplifier driving signal line 17, the following equation is obtained:

$$C28 \cdot \Delta V7 = C21 \cdot \Delta V17 \tag{2}$$

Furthermore, the MIS transistor 19 is rendered non-conductive, so that the movement of charges to the sense amplifier driving signal line 17 is stopped. Thus, the following equation is obtained:

$$Vcc/2 + \Delta V + \Delta V2 - V_{TN} = Vcc/2 - V_{TN} + \Delta V17$$

That is, $$\Delta V + \Delta V2 = \Delta V17 \tag{3}$$

Similarly, the MIS transistor 15 is rendered non-conductive to stop the movement of charges to the bit line 2. Thus, the following equation is obtained:

$$Vcc/2 - \Delta V7 + |V_{TP}| = Vcc/2 + |V_{TP}| - \Delta V14$$

That is, $$\Delta V14 ptm \quad (4)$$

Substitution of the equation (4) into the equation (2) gives:

$$C28 \cdot \Delta V14 = C21 \cdot \Delta V17 \quad (5)$$

On the other hand, from the above described equation (1), the following equation is obtained:

$$\Delta V14 = (C27/C20) \cdot V2 \quad (6)$$

Substitution of the equation (6) into the equation (5) gives:
$(C27 \cdot C28/C20) \cdot \Delta V2 = C21 \cdot \Delta V17$
That is, $$\Delta V17 = (C27 \cdot C28/C20 \cdot C21) \cdot \Delta V2 \quad (7)$$

Substitution of the equation (7) into the equation (3) gives:

$$\Delta V = \{(C27 \cdot C28/C20 \cdot C21) - 1\} \cdot \Delta V2$$

That is, $$\Delta V2 = \Delta V / \{(C27 \cdot C28/C20 \cdot C21) - 1\} \quad (8)$$

Similarly, the following equations are obtained;

$$\begin{aligned} \Delta V7 &= \Delta V14 \\ &= \Delta V / \{C28/C21 - (C20/C27)\} \end{aligned} \quad (9)$$

$$\begin{aligned} \Delta V17 &= (C28/C21) \cdot \Delta V14 \\ &= \Delta V / \{1 - (C20 \cdot C21/C27 \cdot C28)\} \end{aligned} \quad (10)$$

Assuming that $(C27=C28):(C20=C21)=10:1$ and $\Delta V \sim 200$ mV, the following values are obtained:

$$\Delta V2 \approx 200/99 = 2 \text{ mV},$$

$$\Delta V7 = \Delta V14 = 1.1 \times 200 = 220 \text{ mV},$$

$$\leftarrow V17 = 100 \cdot 200/99 = 202 \text{ mV}$$

Using the above described values, the difference Vs in input potential applied to the sense amplifier 50 becomes as follows:

$$\begin{aligned} Vs &= V2 - V7 \\ &= Vcc/2 + \Delta V + \Delta V2 - (Vcc/2 - \Delta V7) \\ &= \Delta V + \Delta V2 + \Delta V7 \\ &= 200 + 2 + 220 \\ &= 422 \text{ mV} \end{aligned} \quad (11)$$

This value is a value obtained when the time interval between the time t5 and the time t6 in FIG. 4 is increased to infinity. The value must be actually set to a relatively short finite time (for example, 15 to 25 ns) in order to read out data from the memory cell at high speed.

On the other hand, a potential between adjacent bit lines is reduced to a value of about one-third to one-fourth of the above described value due to voltage noises caused by capacitive coupling between the bit lines as well as electrical imbalance between the bit lines which is inevitably associated with a practical manufacturing of the memory device, resulting in degradation of operating margin of the sense amplifier circuit. More specifically, it is desirable that the potential difference between input signals is made as large as possible in order to accurately operate the sense amplifier. However, the potential difference between the input signals to the sense amplifier is decreased as described above, so that the operating margin of the sense amplifier circuit is decreased, whereby a reliable sensing operation can not be performed.

SUMMARY OF THE INVENTION

An object of the present invention is to remove a disadvantage that the difference in input potential to a sense amplifier is decreased in the above described conventional dynamic random access memory. More specifically, it is to provide an apparatus and a method for driving a sense amplifier in which the potential difference between a bit line pair at the time of reading out data is increased so that an operation of the sense amplifier can be stabilized and/or speeded up.

In the sense amplifier driving apparatus in a random access memory according to the present invention, there is provided between a pair of sense amplifier driving signal lines for driving a sense amplifier a transmitting device for transmitting the shift in potential on one of the driving signal lines which appears at the time of reading out data stored in a memory cell to the other sense amplifier driving signal line.

The potential shift transmitting device is inactivated before an active operation of the sense amplifier. Preferably, the potential shift transmitting device is structured by coupling capacitive elements.

The sense amplifier driving method according to the present invention includes the steps of capacitively coupling the pair of sense amplifier driving signal lines, reading out the data stored in a memory cell, electrically isolating the pair of sense amplifier driving signal lines and activating the sense amplifier.

In accordance with the sense amplifier driving apparatus and method according to the present invention, the shift in potential on one of paired bit lines which appears at the time of reading out the data stored in a memory cell is transmitted from the one of the sense amplifier driving signal lines to the other sense amplifier driving signal line through the potential shift transmitting apparatus, and further transmitted to the other bit line through a transistor included in the sense amplifier. Consequently, the potential difference between the bit line pair at the time of reading out the data stored in the memory cell can be increased and operation margin of the sense amplifier can be enhanced.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4(a to i) is a diagram showing the shift in potential on each signal line in the conventional sense amplifier driving system;

FIG. 6 (a to e) is a diagram showing the shift in potential on each signal line at the time of reading out the data stored in the memory cell in the conventional sense amplifier;

FIG. 8(a to h) is a waveform diagram showing the shift in potential on each signal line when the sense amplifier driving apparatus according to one embodiment of the present invention is operated;

DESCRIPTION OF THE PREFERRED EMBODIMENTS

Figure 7:
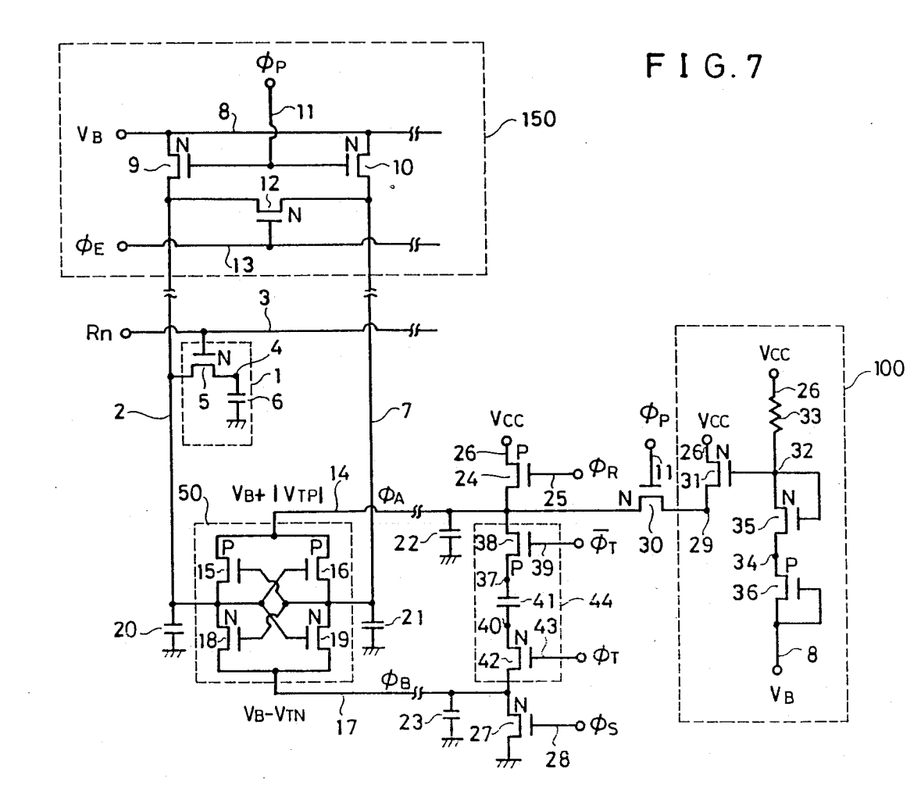
FIG. 7 is a diagram showing a structure of a sense amplifier driving apparatus in a dynamic random access memory according to one embodiment of the present invention.
Figure 8A:
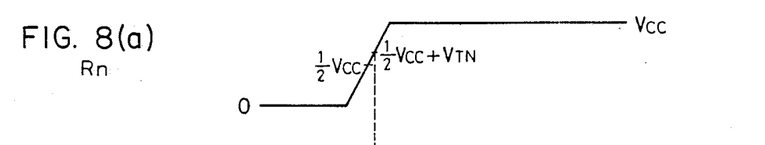
Figure 8B:
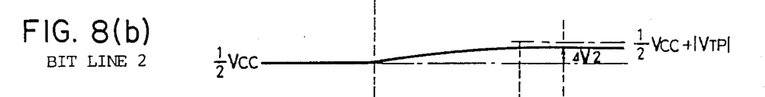
Figure 8C:
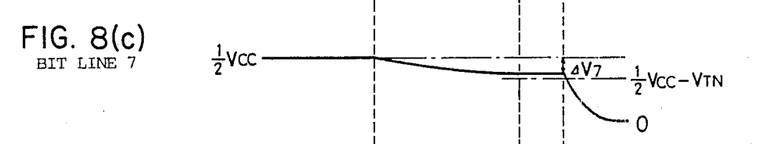
Figure 8D:
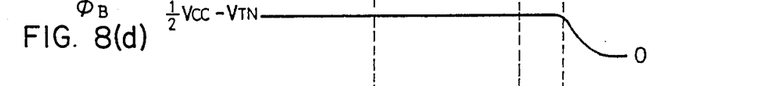
Figure 8E:
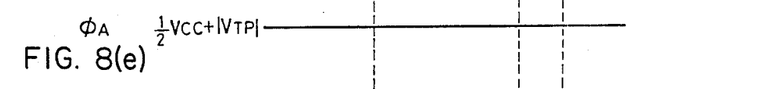
Figure 8F:
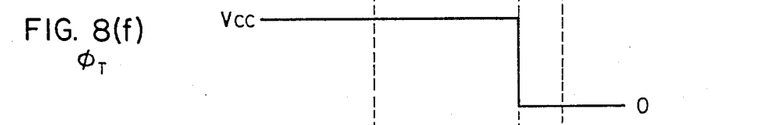
Figure 8G:
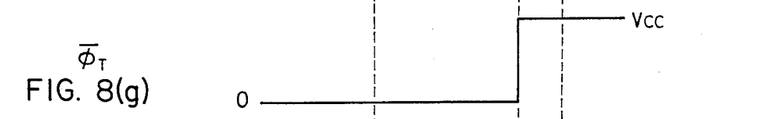
Figure 8H:
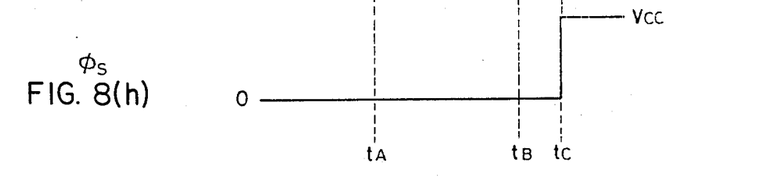

Referring now to FIG. 7, one embodiment of the present invention will be described.

In FIG. 7, portions corresponding to those of the conventional sense amplifier system shown in FIG. 3 have the same reference numerals.

As is clear from comparison of a structure of the apparatus shown in FIG. 7 with the structure of the conventional apparatus shown in FIG. 3, in one embodiment of the present invention, there is provided between a first sense amplifier driving signal line 14 and a second sense amplifier driving signal line 17 a potential shift transmitting circuit 44 for transmitting the shift in potential which appears on one of the sense amplifier driving signal lines to the other sense amplifier driving signal line.

The potential shift transmitting circuit 44 comprises a p channel MIS transistor 38 having one conduction terminal connected to the first sense amplifier driving signal line 14, another conduction terminal connected to a node 37 and the gate coupled to a clock signal $\overline{\phi T}$, a capacitance 41 provided between the node 37 and a node 40, and an n channel MIS transistor 42 having one conduction terminal connected to a node 40, another conduction terminal connected to the second sense amplifier driving signal line 17 and the gate coupled to a clock signal $\phi T$ through a signal line 43. The potential shift transmitting circuit 44 has a function of transmitting the shift in potential which appears on the second sense amplifier driving signal line 17 onto the first sense amplifier driving signal line 14 by capacitive coupling and thereby transferring charges from one bit line to the other bit line through a transistor included in a sense amplifier.

FIG. 8 is a waveform diagram showing an operation to occur when the sense amplifier driving apparatus shown in FIG. 7 is employed, showing the shift in potential on each signal line at the time of reading out data stored in a memory cell. In the waveform diagram of FIG. 8, operation timings of sense amplifier driving signals $\phi R$ and $\phi S$, a precharge signal $\phi P$, an equalize signal $\phi E$, and a word line driving signal Rn are assumed to be the same as those in the conventional example. In the following description, it is assumed that a potential $V_B$ for precharging each bit line is one-half of an operating power-supply potential Vcc, i.e., Vcc/2. Referring now to FIGS. 7 and 8, description is made on an operation of the sense amplifier driving apparatus according to one embodiment of the present invention.

In the same manner as the conventional example, a word line 3 is selected in response to a row address decoded signal, so that the word line driving signal Rn is transmitted onto the word line 3. Then the word line driving signal Rn starts to rise. At a time tA, the word line driving signal Rn reaches Vcc/2+$V_{TN}$ (where $V_{TN}$ is the threshold voltage of a transfer gate transistor included in a memory cell 1), and then an N channel MIS transistor 5 in the memory cell 1 starts to be rendered conductive. Consequently, data of logic "1" is read out from the memory cell 1. More specifically, charges stored in a capacitance 6 in the memory cell 1 are moved toward a bit line 2 side through the MIS transistor 5, so that a potential on the bit line 2 starts to be raised. As the potential on the bit line 2 is raised, the MIS transistor 19 starts to be rendered conductive. As a result, charges stored in a parasitic capacitance 21 of a bit line 7 are moved toward the second sense amplifier driving signal line 17 through an MIS transistor 19, to act to raise a potential thereon. On the other hand, on this occasion, clock signals $\overline{\phi T}$ and $\phi T$ are at a low level of zero volt and Vcc level, respectively, so that both the MIS transistors 38 and 42 in the potential shift transmitting circuit 44 are satisfactorily rendered conductive. As a result, the shift in potential which appears on the second sense amplifier driving signal line 14 is transmitted without any modification to the first sense amplifier driving signal line 17 through the coupling capacitance 41. On this occasion, a potential on the bit line 7 is lowered due to discharging through the MIS transistor 19, so that the MIS transistor 15 is rendered conductive. Thus, all the shift in potential transmitted to the first sense amplifier driving signal line 14 is transmitted to the bit line 2 through the MIS transistor 15, so that the potential on the bit line 2 is further raised. Thereafter, since the MIS transistor 19 remains conductive with the rise in potential on the bit line 2 and the N channel MIS transistor 15 remains in an on state with the fall in potential on the bit line 7, charges on the bit line 7 are transmitted to the bit line 2 through the MIS transistor 19, the second sense amplifier driving signal line 17, the MOS transistor 42, the capacitance 41, the MIS transistor 38, the first sense amplifier driving signal line 14 and the MIS transistor 15. As a result, the potential on the bit line 2 is changed up to a level more than a potential read out from the memory cell 1 while the potential on the bit line 7 is gradually lowered. On this occasion, the sense amplifier driving signal lines 14 and 17 function only as the above described charge transfer medium, so that potentials $\phi A$ and $\phi B$ thereon are not changed, i.e., $Vcc/2 + |V_{TP}|$ and $Vcc/2 - V_{TN}$, respectively. At a time tB, the clock signals $\phi T$ and $\overline{\phi T}$ are raised and lowered, respectively, so that the MIS transistors 38 and 42 are both rendered non-conductive, whereby the sense amplifier driving signal lines 14 and 17 are electrically isolated from each other.

At a time tC, the sense amplifier driving signal $\phi S$ rises, so that a sensing operation on data stored in the memory cell is performed. On this occasion, in the present embodiment, the shift in potential has already appeared in opposite directions on the bit lines 2 and 7, so that the potential difference appears which is approximately two times that in the conventional example. Consequently, a reading margin for a sense amplifier 50 can be increased and an operation thereof can be stabilized.

In addition, if and when the sense amplifier 50 is activated at the time point of the same potential difference between the bit line pair as that in the conventional memory device, the time required to reach the potential difference is substantially reduced, as compared with the conventional example, so that the sense amplifier 50 can be activated at the time point earlier than that in the conventional memory device, whereby data can be read out at high speed.

Additionally, the activation of the sense amplifier 50 is provided by raising the sense amplifier driving signal $\phi S$ at the time tC to turn on the MIS transistor, followed by lowering the potential on the first sense amplifier driving signal line 17 from $Vcc/2 - V_{TN}$ to a ground potential 0V. However, the first and second sense amplifier driving signal lines are electrically isolated from each other with the MIS transistors 38 and 42 being both rendered non-conductive at this time tB immediately before the time tC such that the shift in potential is not transmitted onto the second sense amplifier driving signal line 14 through the capacitance 41.

Although in the above described embodiment, description was made on a state in which the memory cell 1 stores "1", the same description is true in a state in which the memory cell 1 stores "0". In this case, the potential on the bit line 2 is lowered, so that charges are moved through a path of the bit line 2, the MOS transistor 18, the capacitance 41, the MOS transistor 16 and the bit line 7.

Figure 9:
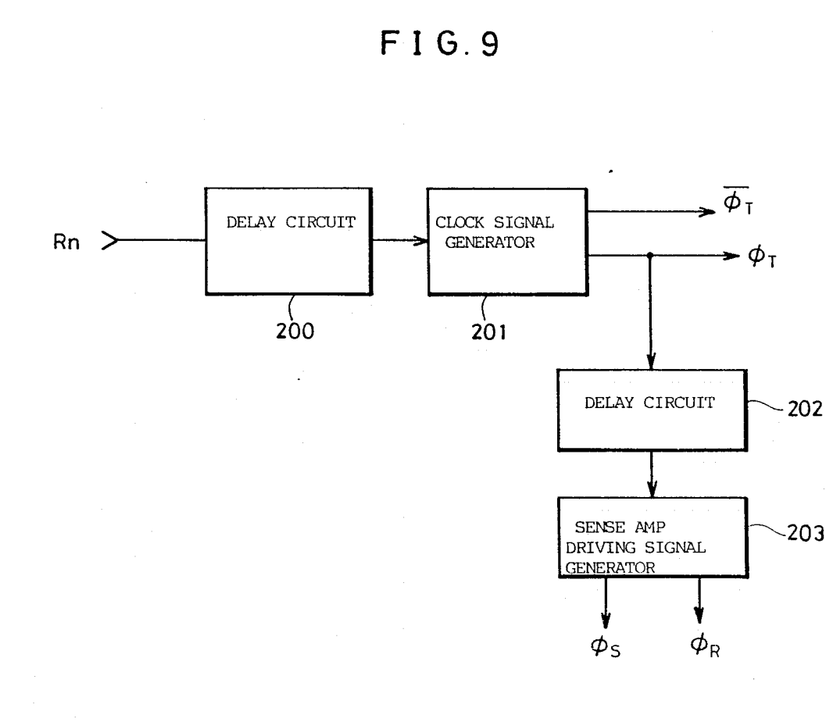
FIG. 9 is a diagram showing an example of a circuit structure for generating a clock signal for controlling an operation of a potential shift transmitting circuit according to one embodiment of the present invention.

FIG. 9 is a diagram showing schematically a circuit structure for generating a clock signal for controlling an operation of the potential shift transmitting circuit 44. The structure shown in FIG. 9 comprises a delay circuit 200 for delaying a word line driving signal Rn by a predetermined time period to output the same, a clock signal generating circuit 201 responsive to a signal from the delay circuit 200 for generating clock signals $\phi T$ and $\overline{\phi T}$, a delay circuit 202 for delaying the clock signal $\phi T$ by a predetermined time period to output the same, and a sense amplifier driving signal generating circuit 203 responsive to a signal from the delay circuit 202 for generating each of sense amplifier driving signals $\phi S$ and $\phi R$. In this structure, the clock signal generating circuit 201 lowers and raises the clock signals $\phi T$ and $\overline{\phi T}$, respectively, since after a lapse of a predetermined time period from a rise in the word line driving signal Rn. The sense amplifier driving signals $\phi S$ and $\phi R$ rises and falls, respectively, a predetermined time period after the clock signal $\phi T$ falls.

Respective rise starting time point and fall starting time point of the clock signals $\phi T$ and $\overline{\phi T}$ are not clearly shown. However, the starting time points may be any time point after the sense amplifier driving signal $\phi S$ rises so that the potential difference between the bit line pair is increased. More specifically, since the potential shift transmitting circuit 44 amplifies the potential difference between the bit line pair at the time of reading out data stored in the memory cell to increase the difference between input potentials to the sense amplifier, the time point when the first sense amplifier driving signal line 14 and the second sense amplifier driving signal line 17 are electrically isolated from each other may be any time point at such timing that the fall of potential on the second driving signal line is not transmitted to the first driving signal line at the time of sensing the potential difference between the bit line pair. In the structure shown in FIG. 9, the delay times of the delay circuits 200 and 202 are set to suitable values in the design of respective memory devices, respectively.

Figure 10:
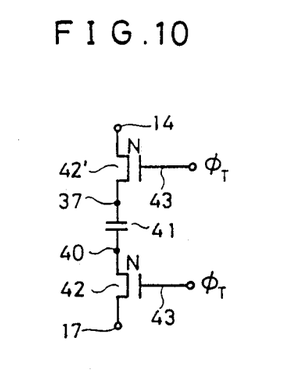
FIG. 10 is a diagram showing a first modified example for the potential shift transmitting circuit shown in FIG. 7.
Figure 11:
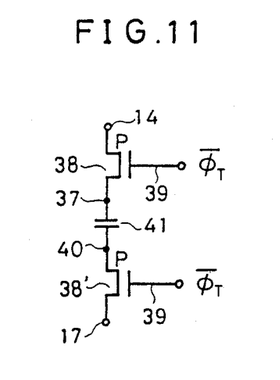
FIG. 11 is a diagram showing a second modified example for the potential shift transmitting circuit shown in FIG. 7.

Although in the above described embodiment, a single p channel MIS transistor and a single n channel MIS transistor are employed to isolate the sense amplifier driving signal lines 14 and 17 from each other, this structure may be replaced with MIS transistors having channels of the same conductivity type as shown in FIGS. 10 and 11, respectively, to obtain the same effect as that of the above described embodiment. FIG. 10 shows a circuit structure where two n channel MIS transistors 42 and 42' are employed, and FIG. 11 shows a structure in which p channel MIS transistors 38 and 38' are employed. However, in this structure, the polarity of each clock signal must be reversed.

Figure 12:
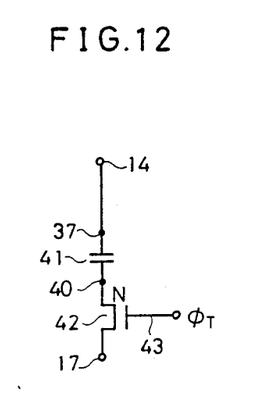
FIG. 12 is a diagram showing a third modified example of the potential shift transmitting circuit shown in FIG. 7.
Figure 13:
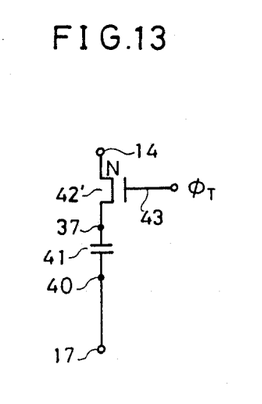
FIG. 13 is a diagram showing a fourth modified example for the potential shift transmitting circuit shown in FIG. 7.

Additionally, although in the structures shown in FIGS. 10 and 11, two MIS transistors are employed, this structure may be replaced with a structure in which a single MIS transistor constitutes a transmitting circuit 44 as shown in FIGS. 12 and 13, to obtain the same effect as that of the above described embodiment. More specifically, in the structure shown in FIG. 12, an n channel MIS transistor 42 is provided between a capacitance 41 and a second sense amplifier driving signal line 17. The n channel MIS transistor 42 has the gate receiving a clock signal $\phi T$ through a signal line 43. In the structure shown in FIG. 13, an n channel MIS transistor 42' is provided between a first sense amplifier driving signal line 14 and a capacitance 41. In addition, in the structures shown in FIGS. 12 and 13, the n channel MIS transistors 42 and 42' may be replaced with p channel MIS transistors, respectively, to obtain the same effect. In this case, an unnecessary current flows through the capacitance 41 at the time of a sensing operation, resulting in a slight increase in power consumption. However, practically, there is no problem, to obtain the same effect as that of the above described embodiment. When the n channel MIS transistors shown in FIGS. 12 and 13 are replaced with the p channel MIS transistors, respectively, the polarity of the clock signal $\phi T$ must be reversed.

Furthermore, in the embodiment shown in FIG. 7, a so-called dummy cell is omitted. However, if the dummy cell is connected to the bit line, the effect of the present invention is further improved.

Figure 14:
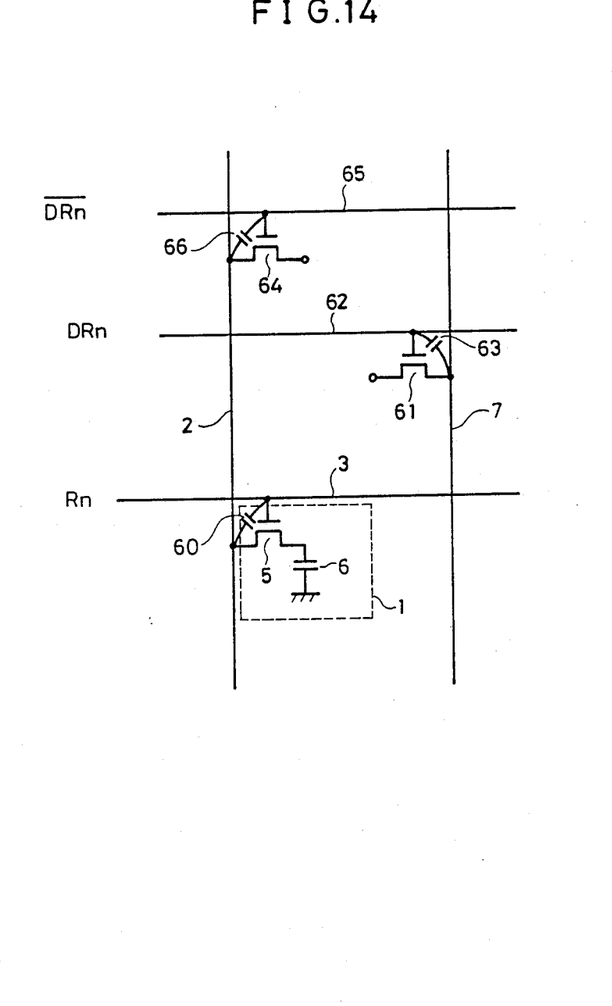
FIG. 14 is a diagram showing an example of a structure where a dummy cell configuration is applied to a bit line structure in another embodiment of the present invention.

In this dummy cell scheme, the dummy word lines 62 and 65 are provided and an MIS transistor 64 having the same shape as that of an MIS transistor 5 in a memory cell 1 is disposed at an intersection of a bit line 2 and the dummy word line 65, as shown in, for example, FIG. 14. In addition, an MIS transistor 61 having the same shape as that of the MIS transistor 5 is also provided at an intersection of the dummy word line 62 and a bit line 7. When a word line 3 is selected, a word line driving signal Rn is transmitted to the word line 3 and a potential on the word line 3 is raised from 0V to Vcc, the word line 3 and the bit line 2 are coupled to each other by a parasitic capacitance 60 between the word line 3 and the bit line 2, so that a potential on the bit line 2 may be slightly raised. To avoid this, a similar parasitic capacitance 63 is formed between the dummy word line 62 and the bit line 7 by the MIS transistor 61 provided at an intersection of the dummy word line 62 and the bit line 7 on the side of the bit line 7 and having the same shape as that of the MIS transistor 5, so that the same coupling voltage as that on the bit line 2 is applied to the bit line 7, whereby voltage noises caused by capacitive coupling are cancelled. More specifically, when the word line 3 is selected, the dummy word line 62 is selected, so that a dummy word line driving signal DRn is transmitted onto the dummy word line 62. On the other hand, when the bit line 7 is selected, the dummy word line 65 is selected, so that a dummy word line driving signal $\overline{DRn}$ is transmitted onto the dummy word line 65. The dummy word line driving signals DRn and $\overline{DRn}$ are both generated at the same timing as that of the word line driving signal Rn and have waveforms of the same shape, respectively. In addition, the dummy word line driving signals DRn and $\overline{DRn}$ can be easily generated in response to a row address decoded signal. As described above, if the dummy cell scheme shown in FIG. 14 is applied to the structure shown in FIG. 7, the operation of the sense amplifier can be further stabilized.

Furthermore, although in the above described embodiment, a discharging operation is first performed using the sense amplifier driving signal line 17 to drive the sense amplifier 50, a charging operation may be first performed using the sense amplifier driving signal line 14, to obtain the same effect as that of the above described embodiment. More specifically, either one of the sense amplifier driving signals $\phi S$ and $\phi R$ may be first changed to an active state.

Additionally, although in the above described embodiment, description was made on the memory device with a 1/2Vcc precharging scheme, it should be noted that the present invention is not limited to the same. For example, the present invention can be applied to a memory device with a Vcc precharging scheme. In this case, the first driving signal line 14 must be kept at a potential higher than the precharge potential. Thus, the power-supply potential Vcc applied to the signal line 28 in FIG. 7 must be made to be a potential Vcc' higher than this operating power-supply potential Vcc.

As described in the foregoing, according to the present invention, since the potential shift transmitting circuit for transmitting to the first sense amplifier driving signal line the shift in potential which appears on the second sense amplifier driving signal line at the time of reading out data stored in the memory cell is provided between the first sense amplifier driving signal line and the second sense amplifier driving signal line, this transmitted charges (i.e., the shift in potential) are transmitted between the bit line pair through the sense amplifier, so that the potential difference between the bit line pair at the time of reading out data stored in the memory cell can be increased. Consequently, the difference between the input potentials at the time of a sensing operation can be increased, so that operating margin of the sense amplifier can be increased. Furthermore, the sense amplifier can be activated at the time point earlier than that in the conventional example if the sense amplifier is driven at the time point when the potential difference between the bit line pair becomes the same as that in the conventional example, so that data can be read out at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier driving apparatus in a dynamic random access memory having a plurality of bit line pairs (BL0, $\overline{BL0}$ to BLn, $\overline{BLn}$) structured by repeatedly arranging first and second bit lines each having a plurality of memory cells connected thereto such that the first and second bit lines are paired with each other and a plurality of sense amplifiers each provided on each of said plurality of bit line pairs and responsive to a signal transmitted through first and second signal lines to be activated for differentially amplifying a signal on a corresponding bit line pair, comprising:

potential shift transmitting means provided between said first and second signal lines for transmitting the shift in potential on said second signal line to said first signal line, and control signal generating means responsive to a control signal for defining timing for reading out information stored in said memory cells for generating a signal for controlling an operation of said potential shift transmitting means.

2. The sense amplifier driving apparatus according to claim 1, wherein said potential shift transmitting means comprises means responsive to an output of said control signal generating means to be inactivated before said sense amplifier is activated for electrically isolating said first signal line and said second signal line.

3. The sense amplifier driving apparatus according to claim 2, wherein said electrically isolating means is activated before information stored in a selected memory cell is transmitted onto a corresponding bit line in response to the control signal for defining the timing for reading out the information stored in said memory cell.

4. A sense amplifier driving apparatus in a dynamic random access memory having a plurality of bit line pairs structured by repeatedly arranging first and second bit lines each having a plurality of memory cells connected thereto such that the first and second bit lines are paired with each other and a plurality of sense amplifiers each provided on each of said plurality of bit line pairs and responsive to a signal transmitted through first and second signal lines to be activated for differentially amplifying a signal on a corresponding bit line pair, comprising:

potential shift transmitting means provided between said first and second signal lines for transmitting the shift in potential on said second signal line to said first signal line, and control signal generating means responsive to a control signal for defining timing for reading out information stored in said memory cells for generating a signal for controlling an operation of said potential shift transmitting means, wherein said potential shift transmitting means comprises capacitive coupling means for capacitively coupling said first signal line and said second signal line.

5. The sense amplifier driving apparatus according to claim 1, wherein said potential shift transmitting means comprises switching means responsive to the output of said control signal generating means to be rendered conductive for transmitting said shift in potential and non-conductive for preventing a shift in potential, and capacitance means connected in series with said switching means.

6. The sense amplifier driving apparatus according to claim 1, wherein said potential shift transmitting means comprises a capacitance, a first insulated gate field effect transistor provided between said capacitance and said first signal line and responsive to the output of said control signal generating means to be rendered conductive for transmitting said shift in potential and non-conductive for preventing a shift in potential, and a second insulated gate field effect transistor provided between said capacitance and said second signal line and responsive to the output of said control signal generating means to be rendered non-conductive.

7. The sense amplifier driving apparatus according to claim 1, wherein said potential shift transmitting means comprises a capacitance having a first electrode coupled to said first signal line and having a second electrode, and an insulated gate field effect transistor provided between said second electrode of said capacitance and said second signal line and responsive to the output of said control signal generating means to be rendered conductive for transmitting said shift in potential and non-conductive for preventing a shift in potential.

8. The sense amplifier driving apparatus according to claim 2, wherein said potential shift transmitting means comprises a capacitance having a first electrode coupled o said second signal line and having a second electrode, and an insulated gate field transistor provided between said second electrode of said capacitance and said first signal generating means to be rendered conductive for transmitting said shift in potential and non-conductive for preventing a shift in potential.

9. A sense amplifier driving apparatus in a dynamic random access memory having a plurality of bit line pairs structured by repeatedly arranging first and second bit lines each having a plurality of memory Cells connected thereto such that the first and second bit lines are paired with each other and a plurality of sense amplifiers each provided on each of said plurality of bit line pairs and responsive to a signal transmitted through first and second signal lines to be activated for differentially amplifying a signal on a corresponding bit line pair, comprising:

potential shift transmitting means provided between said first and second signal lines for transmitting the shift in potential on said second signal line to said first signal line, and control signal generating means responsive to a control signal for defining timing for reading out information stored in said memory cells for generating a signal for controlling an operation of said potential shift transmitting means, wherein said sense amplifier comprises a pair of cross-coupled n channel insulated gate field effect transistors provided between said first bit line, the respective remaining electrodes thereof being coupled to said second signal line, and a pair of cross-coupled p channel insulated gate field effect transistors provided between said first bit line, the respective remaining electrodes thereof being coupled to said first signal line, said first signal line being provided with means for keeping a potential on said first signal line at a value higher, by the absolute value of each threshold voltage of said pair of p channel insulated gate field effect transistors, than a precharge potential during a precharging period of said bit lines.

10. The sense amplifier driving apparatus according to claim 1, which further comprises a dummy cell connected to each of said first bit line and said second bit line and having the capacitance value of the same capacitance as that of each of said plurality of memory cells.

11. A method for driving a sense amplifier in a dynamic random access memory having a plurality of bit line pairs structured by arranging first and second bit lines each having a plurality of memories connected thereto such that the first and second bit lines are paired with each other and a plurality of sense amplifiers each provided for each of said plurality of bit line pair and responsive to a signal transmitted through first and second signal lines to be activated for differentially amplifying a signal on a corresponding bit line pair, comprising the steps of:

capacitively coupling said first signal line and said second signal line, making access to said plurality of memory cells to transmit information stored in the selected memory cell onto a corresponding bit line, and electrically isolating said first signal line and said second signal line from each other before activation of said sense amplifiers.

* * * * *